United States Patent [19]
Gallagher

[11] Patent Number: 6,071,353
[45] Date of Patent: Jun. 6, 2000

[54] PROTECTION OF CONSUMABLE SUSCEPTOR DURING ETCH BY A SECOND COATING OF ANOTHER CONSUMABLE MATERIAL

[75] Inventor: Peter Gallagher, Mountain View, Calif.

[73] Assignee: Applied Materials, Inc., Santa Clara, Calif.

[21] Appl. No.: 08/962,410

[22] Filed: Oct. 31, 1997

[51] Int. Cl.⁷ .............................. B08B 3/08; B08B 5/00; C25F 3/02; C25F 3/12
[52] U.S. Cl. .................................. 134/2; 134/1.1; 134/3; 134/22.1; 134/37; 216/2; 216/37; 216/74; 216/79; 216/99
[58] Field of Search .......................... 134/1.1, 2, 3, 22.1, 134/37; 216/37, 2, 74, 79, 99

[56] References Cited

U.S. PATENT DOCUMENTS

| | | | |
|---|---|---|---|
| 4,867,841 | 9/1989 | Loewenstein et al. | 438/711 |
| 5,565,038 | 10/1996 | Ashley | 134/2 |
| 5,849,092 | 12/1998 | Xi et al. | 134/1.1 |
| 5,868,852 | 2/1999 | Johnson et al. | 134/1.1 |
| 5,926,743 | 7/1999 | Xi et al. | 438/905 |

*Primary Examiner*—Rabon Sergent
*Attorney, Agent, or Firm*—Blakely Sokoloff Taylor & Zafman

[57] ABSTRACT

The present invention is a method for cleaning a process chamber without damaging the process kit by coating the process kit with another consumable material that protects the process kit during the etch that removes buildup from the processing chamber. First, a polysilicon layer is deposited on at least one inner surface of the processing chamber. Next, a silicon nitride layer deposition is performed on at least one semiconductor substrate in the processing chamber. The semiconductor substrate having said nitride layer thereon is then removed from the processing chamber. An etch is then performed to remove the nitride layer buildup from the inner surface of the processing chamber that has the polysilicon layer thereon.

24 Claims, 3 Drawing Sheets

PROTECTION OF CONSUMABLE SUSCEPTOR DURING ETCH BY A SECOND COATING OF ANOTHER CONSUMABLE MATERIAL

BACKGROUND OF THE INVENTION

1. Field of the Invention

This invention relates to the field of semiconductor processing, and more specifically, to a method for cleaning a processing chamber in order to remove dielectric film or deposited film buildup.

2. Background Information

In the manufacture of semiconductor devices many layers are deposited on semiconductor substrates using process chambers. Some process chambers may be plasma vapor deposition chambers, chemical vapor deposition chambers, etc. As the layers, for example nitride and oxide layers, are deposited on the semiconductor substrate(s) some of the deposition material may also be deposited on the inner surfaces of the process chamber. This deposition material builds up on the inner surfaces of the process chamber and may eventually begin to flake off thereby contaminating the substrates that are currently being processed within the chamber. Such contamination of the substrate(s) may cause reliability problems and even device failure in the devices being fabricated.

Because it is desirable to keep the substrates as free of particulates and contaminants as possible during processing, it is necessary to clean the process chamber and remove this deposition material buildup. Depending upon the particular deposition material being used and the thickness of the layer being deposited it may be desirable to clean the processing chamber after every couple hundred of wafers are processed.

One problem with cleaning the process chamber, especially when cleaning oxide and/or nitride buildup, is that the etchants used to remove the buildup may also etch the process kit. It should be noted that the term process kit is used throughout the present disclosure to refer to the inner workings of the processing chamber, for example, the susceptor, table, moving parts for transferring the substrates, etc. The etchant used to remove the buildup damages the process kit and may require that the process kit be replaced or repaired.

Repairing and/or replacing the parts of the process kit can be expensive in the cost of the parts alone. However, to a manufacturer it may also be expensive in the amount of down time that is required to repair the processing chamber. Increased down time may decrease the efficiency and the throughput of the manufacturer's entire line.

Thus, what is needed is a method for removing the deposition material buildup from the inner surfaces of the processing chamber without damaging the process kit.

SUMMARY OF THE INVENTION

The present invention describes a method for cleaning a processing chamber. First, a polysilicon layer is deposited on at least one inner surface of the processing chamber. Next, a silicon nitride or oxide layer deposition is performed on at least one semiconductor substrate in the processing chamber. The semiconductor substrate having said nitride layer thereon is then removed from the processing chamber. An etch is then performed to remove the nitride layer buildup from the inner surface of the processing chamber that has the polysilicon layer thereon.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A method for protection of a consumable susceptor during etch by a second coating of another consumable material is disclosed. In the following description, numerous specific details are set forth such as specific materials, chemicals, process parameters, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention is a method for cleaning a process chamber without damaging the process kit by coating the process kit with another consumable material that protects the process kit during the etch that removes buildup from the processing chamber. During deposition of certain layers on a semiconductor substrate, for example a nitride or an oxide layer, the material being deposited on the substrate may also be deposited (or build up) on the inside of the process chamber being used to perform the deposition.

Figure 1:
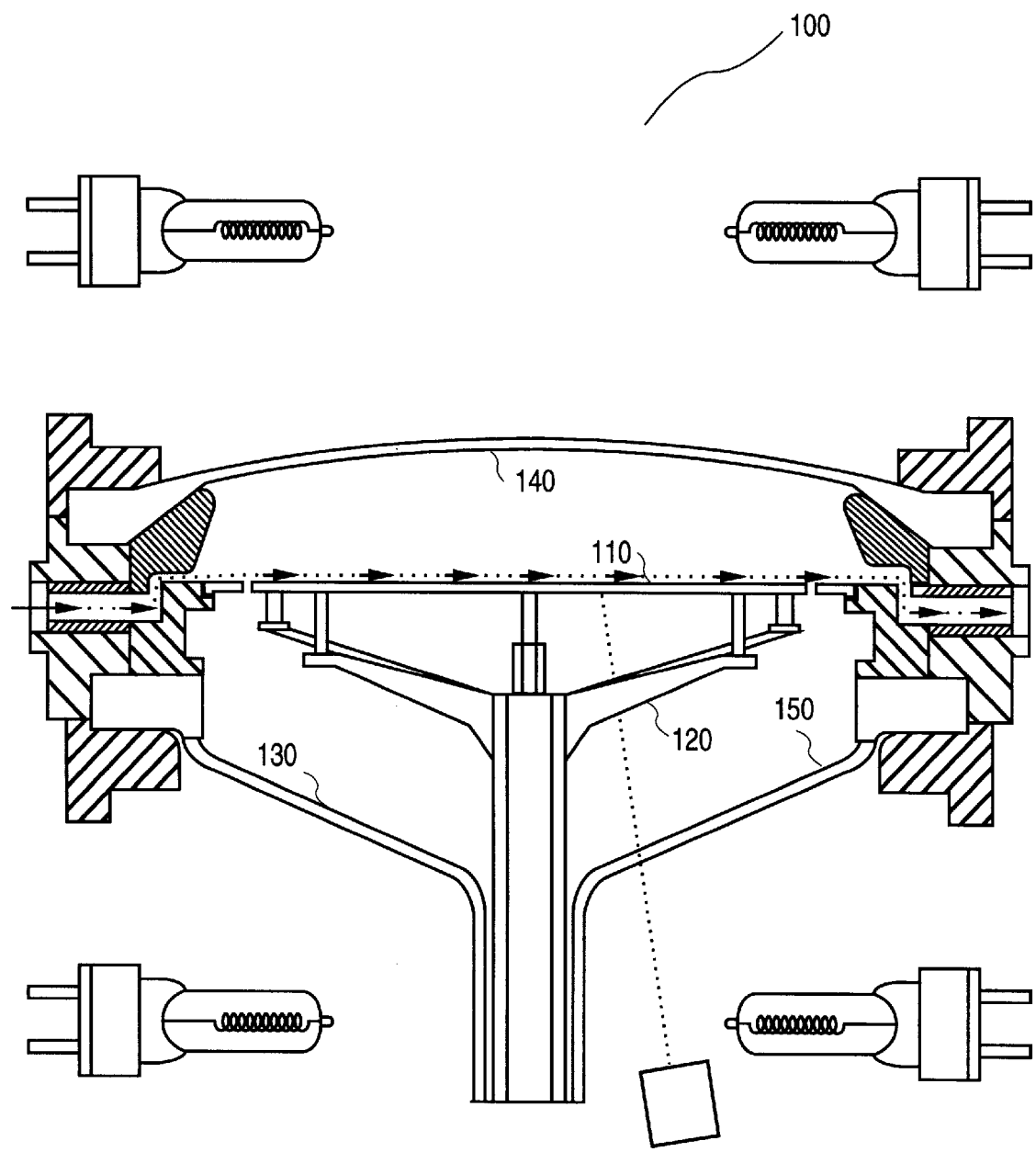
FIG. 1 illustrates a cross-sectional view of a processing chamber.

FIG. 1 illustrates a chemical vapor deposition (CVD) processing chamber (processing chamber) 100. One example of a processing chamber is the Centura Processing Chamber available from Applied Materials Incorporated in Santa Clara, Calif. It should be noted that although the present invention is described in conduction with a CVD processing chamber, the present invention may also be used in other processing chambers. Within the processing chamber 100 there is what may be referred to as a process kit. The process kit may include a susceptor 110 and a susceptor support 120, etc. Processing chamber also has inner walls 130, 140 and 150.

During processing a substrate (not shown) is placed on susceptor 110. Then a gas mixture is released into processing chamber 100. This gas mixture reacts within the processing chamber and results in the deposition of a silicon nitride or silicon oxide layer on the substrate. Because the deposition of the nitride or oxide layer cannot be limited to just the substrate the nitride or oxide also is deposited on the inner walls 130, 140 & 150 as well as the process kit (susceptor 110, table 120, etc.) of the processing chamber. The deposition of the nitride or oxide on the inner walls and process kit of the processing chamber is also referred to as "buildup". This buildup must be removed from the processing chamber in order to reduce contamination of the substrates. Thus, after a select number of substrates are processed through the processing chamber the processing chamber must be cleaned to remove the buildup of deposition material. It should be noted that a particular manufacturer may select how often to clean the processing chamber based upon factors such as: deposition material, thickness of the layer to be deposited, number of substrates processed, etc.

Figure 2A:
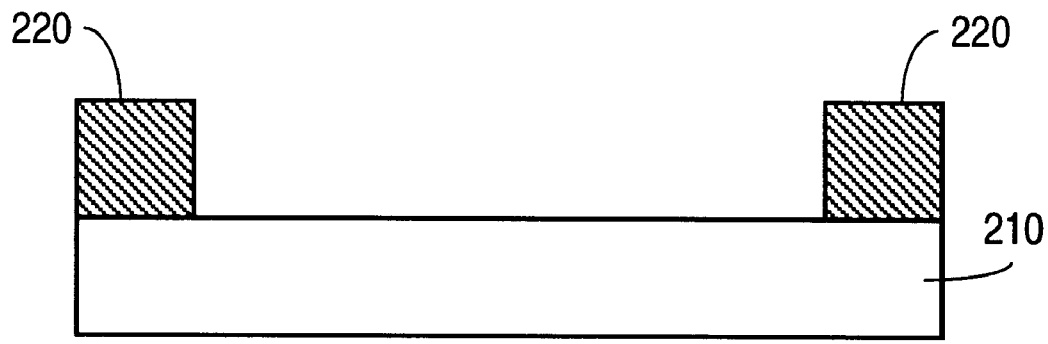
FIGS. 2a–2b illustrated a prior art method for cleaning a process chamber.

FIG. 2a illustrates a susceptor 210 with buildup 220 thereon. Buildup 220 may be a nitride or oxide depending upon the particular chemistry and layer being deposited within the chamber. In the prior art, to remove buildup 220 an etch was performed. The etchant used was selected based upon the particular deposition material, for example, if buildup 220 was a nitride an etchant that would remove a nitride would be used.

Figure 2B:
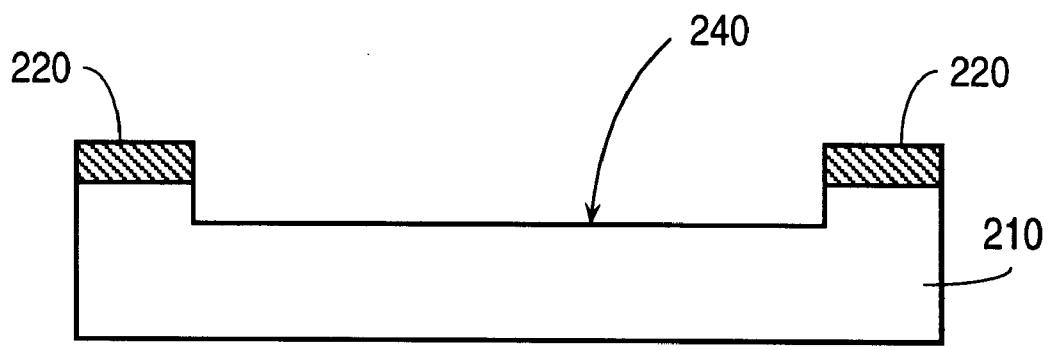

FIG. 2b illustrates the susceptor and buildup of FIG. 2a after a portion of the buildup 220 has been removed using an etchant. As illustrated in FIG. 2b, the etchant not only removes buildup 220, but also attacks the susceptor 210 itself and causes damage within the susceptor pocket 240.

The present invention protects the process kit from damage during the cleaning process by depositing a consumable material over the process kit prior to the deposition of the nitride or oxide layer on the substrate. In one embodiment of the present invention a polysilicon layer is deposited on the process kit prior to the deposition of the nitride or oxide layer on the substrate.

Figure 3A:
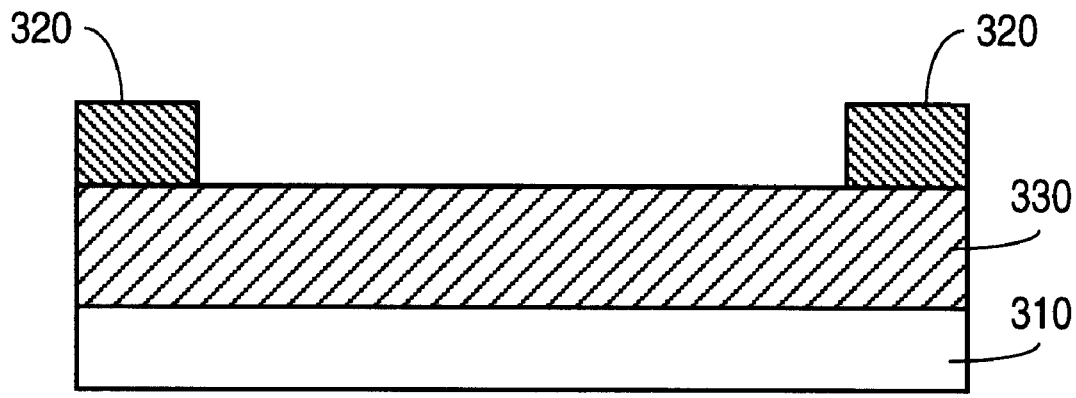
FIGS. 3a–3c illustrate an embodiment of the present invention.

FIG. 3a illustrates on embodiment of the present invention. As shown in FIG. 3a, before processing is begun in the processing chamber a polysilicon layer 330 is deposited on the susceptor 310. Then a substrate (not shown) is loaded into the processing chamber and placed on the susceptor. The deposition process is then performed to deposit a nitride or oxide layer on the substrate surface. The deposition process is repeated for a selected number of substrates before the processing chamber is cleaned.

Once the selected number of substrates have been processed in the processing chamber the chamber is then cleaned. Typically, the processing chamber is cleaned using an etchant that will remove nitride and/or oxide. For example, in one embodiment of the present invention $NF_3$ or $ClF_3$ may be used as the etchant. The cleaning/etch process to remove the nitride or oxide buildup is performed at a temperature in the range of approximately 300–1000° C. and a pressure in the range of approximately 200–400 torr.

Figure 3B:
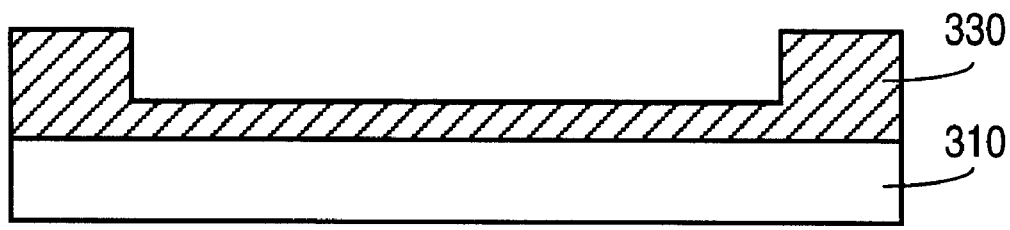

FIG. 3b illustrates the susceptor 310 and polysilicon layer 330 after the removal of buildup 320. As shown, the etch of the buildup removed a portion of the polysilicon layer 330 but did not etch into the susceptor 310. Thus, the process kit was not damaged by the nitride or oxide etch. In order to complete the clean of the processing chamber the remaining polysilicon layer 330 is also removed.

Figure 3C:
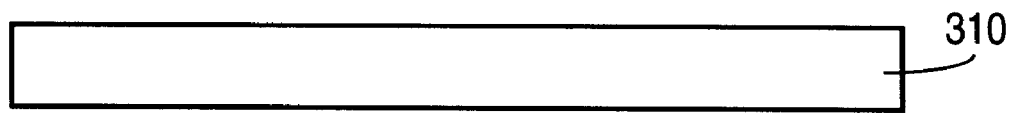

Removal of the polysilicon layer may be performed using a high temperature HCl. A high temperature HCl is sufficient to remove the remaining polysilicon, but will not damage (or etch) the process kit. FIG. 3c illustrates the susceptor 310 after the remaining polysilicon layer has been removed.

It should be noted that the thickness of the polysilicon layer to be deposited depends upon the amount/thickness of the nitride or oxide layers to be deposited on the substrate. Once a particular manufacturer determines the amount of nitride or oxide to be deposited, the manufacturer can calculate how much polysilicon to deposit on the process kit. In order to protect the process kit it is desirable to deposit a polysilicon layer that has a thickness greater than the potential nitride or oxide buildup. In one embodiment of the present invention approximately $15\mu$ of polysilicon is deposited for every $10\mu$ of nitride or oxide.

Although the above description describes the use of the present invention with regard to nitride and oxide layers, it should be noted that the present invention may be used with any film that may be difficult to remove (or etch) without damaging the process kit.

Thus, a method for protection of a consumable susceptor during etch by a second coating of another consumable material has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method for cleaning a processing chamber comprising:
    depositing a polysilicon layer on at least one inner surface of said processing chamber;
    depositing a silicon nitride layer on at least one semiconductor substrate in said processing chamber;
    removing said at least one semiconductor substrate having said nitride layer thereon from said processing chamber; and
    etching a nitride layer buildup from said at least one inner surface of said processing chamber having said polysilicon layer thereon.

2. The method as described in claim 1 further comprising the step of:
    etching said polysilicon layer to remove said polysilicon layer from said at least one inner surface after said step of etching said nitride buildup.

3. The method as described in claim 2 wherein said polysilicon layer is etched using HCl.

4. The method as described in claim 1 wherein said nitride layer buildup is etched using one or more of the following: $NF_3$ and $ClF_3$.

5. The method as described in claim 1 wherein said nitride layer buildup is etched at a temperature in the range of approximately 300–1000° C.

6. The method as described in claim 1 wherein said nitride layer buildup is etched at a pressure in the range of approximately 200–400 torr.

7. A method for cleaning a processing chamber comprising:
    depositing a polysilicon layer on at least one inner surface of said processing chamber;
    depositing a silicon oxide layer on at least one semiconductor substrate in said processing chamber;
    removing said at least one semiconductor substrate having said oxide layer thereon from said processing chamber; and
    etching an oxide layer buildup from said at least one inner surface of said processing chamber having said polysilicon layer thereon.

8. The method as described in claim 7 further comprising the step of:
    etching said polysilicon layer to remove said polysilicon layer from said at least one inner surface after said step of etching said oxide layer buildup.

9. The method as described in claim 8 wherein said polysilicon layer is etched using HCl.

10. The method as described in claim 7 wherein said oxide layer buildup is etched using one or more of the following: $NF_3$ and $ClF_3$.

11. The method as described in claim 7 wherein said oxide layer buildup is etched at a temperature in the range of approximately 300–1000° C.

12. The method as described in claim 7 wherein said oxide layer buildup is etched at a pressure in the range of approximately 200–400 torr.

13. A method for cleaning a processing chamber comprising:

depositing a polysilicon layer on at least one inner surface of a processing chamber;

performing a nitride layer deposition on at least one semiconductor substrate in said processing chamber; and etching a nitride layer buildup from said at least one inner surface of said processing chamber.

14. The method as described in claim 13 further comprising the step of:

etching said polysilicon layer to remove said polysilicon layer from said at least one inner surface after said step of etching said nitride layer buildup.

15. The method as described in claim 14 wherein said polysilicon layer is etched using HCl.

16. The method as described in claim 13 wherein said nitride layer buildup is etched using one or more of the following: $NF_3$ and $ClF_3$.

17. The method as described in claim 13 wherein said nitride layer buildup is etched at a temperature in the range of approximately 300–1000° C.

18. The method as described in claim 13 wherein said nitride layer buildup is etched at a pressure in the range of approximately 200–400 torr.

19. A method for cleaning a processing chamber comprising:

depositing a polysilicon layer on at least one inner surface of a processing chamber;

performing an oxide layer deposition on at least one semiconductor substrate in said processing chamber; and etching an oxide layer buildup from said at least one inner surface of said processing chamber.

20. The method as described in claim 19 further comprising the step of:

etching said polysilicon layer to remove said polysilicon layer from said at least one inner surface after said step of etching said nitride layer buildup.

21. The method as described in claim 20 wherein said polysilicon layer is etched using HCl.

22. The method as described in claim 19 wherein said oxide layer buildup is etched using one or more of the following: $NF_3$ and $ClF_3$.

23. The method as described in claim 19 wherein said oxide layer buildup is etched at a temperature in the range of approximately 300–1000° C.

24. The method as described in claim 19 wherein said oxide layer buildup is etched at a pressure in the range of approximately 200–400 torr.

* * * * *